United States Patent [19]

Wiese

[11] Patent Number: 5,991,715
[45] Date of Patent: Nov. 23, 1999

[54] PERCEPTUAL AUDIO SIGNAL SUBBAND CODING USING VALUE CLASSES FOR SUCCESSIVE SCALE FACTOR DIFFERENCES

[75] Inventor: Detlef Wiese, Neufahrn, Germany

[73] Assignee: Institut Für Rundfunktechnik GmbH, München, Germany

[21] Appl. No.: 08/521,817

[22] Filed: Aug. 31, 1995

Related U.S. Application Data

[63] Continuation of application No. 08/094,028, filed as application No. PCT/EP91/01211, Jun. 27, 1991, abandoned.

[30] Foreign Application Priority Data

Jan. 26, 1991 [DE] Germany .............................. 41 02 324

[51] Int. Cl.[6] ...................................................... G10L 7/04
[52] U.S. Cl. ......................... 704/204; 704/205; 704/227; 704/503
[58] Field of Search .................................... 704/204, 205, 704/227, 503

[56] References Cited

U.S. PATENT DOCUMENTS 4,464,783  8/1984  Beraud et al. ........................... 704/212
4,972,484  11/1990  Theile et al. ............................ 704/227

FOREIGN PATENT DOCUMENTS

064119A3  11/1982  European Pat. Off. .
3328344C1  12/1984  Germany .
3639753C2  6/1988  Germany .

OTHER PUBLICATIONS

Plenge et al., "Combined Channel Coding and Concealment," *IEE Colloquim on Terrestrial DAB — Where is it Going?*, (Digest No. 042) p. 3/1–8, Feb. 17, 1993.

*Primary Examiner*—David R. Hudspeth
*Assistant Examiner*—Tālivaldis Ivars Šmits
*Attorney, Agent, or Firm*—Venable; George H. Spencer; Robert Kinberg

[57] ABSTRACT

A method of transmitting digitized block coded audio signals includes forming scale factors of the digitized audio signals. The n(k−1) differences are formed from k successively in-time scale factors for each frequency sub-band or for a group of spectral values of the audio signal. The n(k−1) differences are grouped into at least two value classes. New scale factors are selected for each of the n sub-bands or spectral value groups based on a sequence of n(k−1) value classes. Identifying information, including the control information indicating at which locations in the sequence of n(k−1) value classes the selected new scale factors are disposed, is associated with each sequence of n(k−1) value classes. The associated selected new scale factors are assigned to each sequence of the sampled signal values and to the identifying information associated with each sequence of sampled signal values. A transmission pattern of new scale factors is determined separately for each of the n sub-bands or spectral value groups. Lastly, audio signals are regenerated from the sampled signal values and from the assigned selected new scale factors.

2 Claims, 1 Drawing Sheet

PERCEPTUAL AUDIO SIGNAL SUBBAND CODING USING VALUE CLASSES FOR SUCCESSIVE SCALE FACTOR DIFFERENCES

This application is a Continuation of application Ser. No. 08/094,028, filed Jul. 26, 1993 (now abandoned), which is a 371 of PCT/EP91/01211 Jun. 6, 1991.

BACKGROUND OF THE INVENTION

1. Field of the Invention

The invention relates to a method of transmitting digitized block coded audio signals using scale factors formed during block coding of the digitized audio signals based on a peak value of a sequence of signal values of the digitized audio signals, especially during irrelevance and redundance reducing methods. Such a method is disclosed in German Patent 3,328,344.

2. Description of the Related Art

It is known (German Patent 3,328,344) to transmit digitized audio signals by forming a scale factor during block coding from the amount of the peak value of a sequence (block) of signal values, with this scale factor indicating in which one of several magnitude ranges the amplitude of the peak value lies. In addition, as disclosed in German Patent 3,639,753, the sampled signal values may be represented in a plurality of spectral sub-band signals and the sampled values of the individual sub-bands may be changed as determined by the respective masking threshold of the human auditory system in the sense of a reduction of irrelevance and redundance. Instead of dividing the digitized audio signal into spectral sub-bands, it is also possible to subject the digitized audio signal to a Fourier analysis and to determine the scale factors for groups of spectral values as well as to perform a reduction of irrelevance and redundance.

SUMMARY OF THE INVENTION

In contrast thereto it is the object of the invention to perform an information reduction also for the scale factors by means of which the data rate which is necessary for a digital audio transmission is further reduced.

This is accomplished according to the invention by a method of transmitting digitized block coded audio signals including the steps of forming scale factors of the digitized audio signals based on a peak value of a sequence of sampled signal values of the digitized audio signals, forming $n(k-1)$ differences from k successively in-time scale factors for each frequency sub-band or for a group of spectral values of the audio signal with n being greater than or equal to 1, grouping the $n(k-1)$ differences into at least two value classes with each value class including a quantity of at least one possible difference of scale factors, selecting new scale factors for each of the n sub-bands or spectral value groups based on a sequence of $n(k-1)$ value classes with the number of successive different selected scale factors within each sequence of $n(k-1)$ value classes being less than or equal to a number of successive different scale factors of each sub-band or spectral value group, associating identifying information with each sequence of $n(k-1)$ value classes, the identifying information identifying an association of each of the selected new scale factors with at least one of the k sequences of the sampled signal values for each respective sub-band or spectral value group and including control information indicating at which locations in the sequence of $n(k-1)$ value classes the selected new scale factors are disposed, assigning the associated selected new scale factors to each sequence of the sampled signal values and to the identifying information associated with each sequence of sampled signal values, determining a transmission pattern of new scale factors separately for each of the n sub-bands or spectral value groups based on psychoacoustic aspects with respect to pre-masking and post-masking effects of a human auditory system with a distinction being made between psycho-acoustically relevant changes in the scale factors, and regenerating audio signals from the sampled signal values and from the assigned selected new scale factors.

BRIEF DESCRIPTION OF THE DRAWING

The invention will be described in greater detail below with reference to the sole FIGURE showing a flow chart of a method according to the invention for transmitting digitized block coded audio signals.

DETAILED DESCRIPTION OF THE PREFERRED EMBODIMENT

Figure 1:
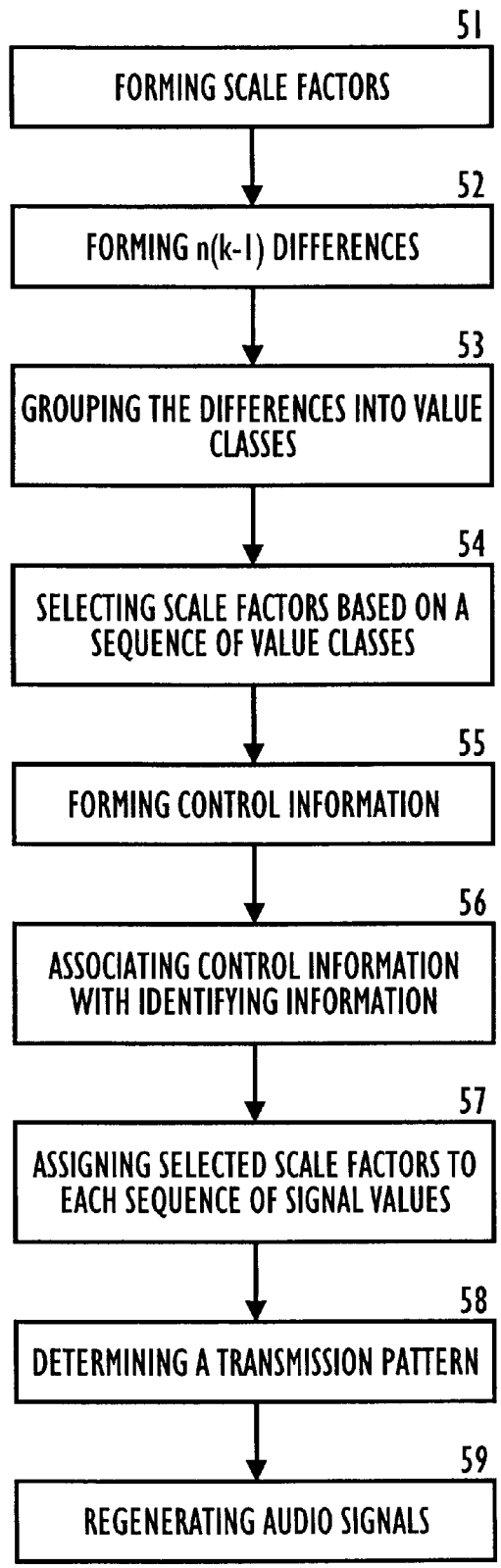

The invention will now be described in greater detail with reference to an embodiment thereof.

The bit saving scale factor transmission is based on the detection and coding of patterns, thus eliminating redundance as well as irrelevance.

The input matrix is composed of k columns and n rows, with k representing the number of scale factors that are successive in time and n representing the number of sub-bands (step S1 of the FIGURE). The description hereinafter generally is given in the left-hand column while an example is given in the right-hand column. The example (right) relates to three successive scale factors comprising a total of 32 sub-bands (hereinafter called a frame). The scale factors are quantized with 6 bits and are thus able to take on $2^6=64$ possible values. A block for which a scale factor is formed has a length of 8 ms.

Input matrix:

$$\begin{bmatrix} scf_{11} & scf_{12} & \ldots & scf_{1k} \\ scf_{21} & & & \\ \vdots & & & \\ scf_{n1} & \ldots & \ldots & scf_{nk} \end{bmatrix} \quad \begin{bmatrix} scf_{11} & scf_{12} & \ldots & scf_{13} \\ scf_{21} & & & \\ \vdots & & & \\ scf_{32\,1} & \ldots & \ldots & scf_{32\,3} \end{bmatrix} \quad \begin{array}{l} 3 * 6 \text{ bits} = 18 \text{ bits} \\ 3 * 6 \text{ bits} = 18 \text{ bits} \\ \\ 3 * 6 \text{ bits} = 18 \text{ bits} \end{array}$$

total frame 32 * 18 bits = 576 bits

Now the differences d of successive values of each row and/or column are calculated (step S2). They are stored in an intermediate matrix. The magnitude of the differences is a function of the absolute block length (row) or of the width of the sub-bands (column). Hereinafter only timely successive scale factors are considered, for example:

$$d_{1,21} = scf_{12} - scf_{11} | \text{ditto}$$

The intermediate matrix has $k-1$ columns (and when considering the columns, also $n-1$ rows).

Intermediate matrix:

$$\begin{bmatrix} d_{1,21} & d_{1,32} & \ldots & d_{1,kk} \\ d_{2,21} & & & \\ \vdots & & & \\ d_{n,21} & \ldots & \ldots & d_{n,kk-1} \end{bmatrix} \begin{bmatrix} d_{1,21} & d_{1,32} \\ d_{2,21} & \\ \vdots & \\ d_{32,21} & d_{32,32} \end{bmatrix}$$

With the aid of a table, the possible differences $D_1$ are grouped into L classes. One class l is a quantity of one or more differences D. For the example on the righthand side, the differences D are assigned to five classes L (step S3), with one or several possible differences belonging to one class:

| | | |
|---|---|---|
| $L_1 = \{D_1, D_2 \ldots D_6\}$ | if $d < -2$ and $d > -64$ | $l_1$ |
| $L_2 = \{D_7, D_8 \ldots D_{12}\}$ | if $d > -3$ and $d < 0$ | $l_2$ |
| $L_3 = \{D_{13}, D_{14}, \ldots D_{17}\}$ | if $d = 0$ | $l_3$ |
| $L_4 = \{D_{18}\}$ | if $d < 3$ and $d > 0$ | $l_4$ |
| . | if $d > 2$ and $d < 64$ | $l_5$ |
| . | | |
| $L_n = \{D_{i-4}, D_{i-3}, \ldots D_i\}$ | | |

All possible sequences of classes L result in $(k-1)^L$ possibilities for combination c (step S4):

$c_1 = L_1 L_1 \ldots L_1$ $c_2 = L_1 L_1 \ldots L_2$ $c_3 = L_1 L_1 \ldots L_3$

.
.
.

$c_{(k-1)L} = L_{k-1} L_{k-1} \ldots L_{k-1}$

Data reduction is realized in that the combinations c are each assigned a scale factor transmission pattern. This pattern is composed of a control information and a sequence of scale factors (steps S6 and S7), with the quantity of different scale factors within a sequence being smaller than or equal to the quantity of the different scale factors from the input matrix. The transmission patterns evolving from the classified differences are determined (step S8) on the basis of statistical knowledge of the signal and according to psycho-acoustic aspects with reference to the pre-masking and post-masking effects of the human auditory system. If, for example, the scale factors of a row in the input matrix do not change, it is not necessary to transmit all scale factors since this is redundant information (redundance). Ascending scale factors must be transmitted more accurately than descending scale factors since it is known from psycho-acoustics that the human auditory system exhibits distinct post-masking in a range up to 200 ms, but pre-masking only in a range up to 20 ms (irrelevance). The assigned selected scale factors are then used to regenerate the audio signal (step S9).

If an input matrix has, for example, three columns, and it is considered row by row, two differences result that must be classified and 25 possible combinations c. Each combination c is assigned a scale factor transmission pattern. This results in a certain number of scale factors to be transmitted and in a control information at which position the scale factors are located or change (step S5), respectively. In this example, one, two or three scale factors must be transmitted and a control information of 2 bits.

| Class Sequence | Combi-nation | Transmission Pattern | Number of SCF | Control Inform. |
|---|---|---|---|---|
| $L_1 L_1$ | $c_1$ | scf1 scf2 scf3 | 3 (18 bit) | 11 (2 bit) |
| $L_1 L_2$ | $c_2$ | scf1 scf2 | 2 (12 bit) | 01 (2 bit) |
| $L_1 L_3$ | $c_3$ | scf1 scf2 | . . . | |
| $L_1 L_4$ | $c_4$ | scf1 scf3 | . . . | |
| $L_1 L_5$ | . | . . . | . . . | |
| $L_2 L_1$ | $c_6$ | scf1 scf3 | 2 (6 bit) | 10 (2 bit) |
| $L_2 L_2$ | $c_7$ | scf1 | 1 (6 bit) | 00 (2 bit) |
| $L_2 L_3$ | | . | . . . | |
| $L_2 L_4$ | | . | | |
| $L_2 L_5$ | | . | | |
| $L_3 L_1$ | | | | |
| . | | | | |
| . | | | | |
| $L_5 L_5$ | | | | |

Four possible transmission patterns and thus a control information of 2 bits result for this example:

1. three different scale factors s1 s2 s3                                                             00 data flow for a frame $(3 * 6 \text{ bit}+2 \text{ bit}) * 32=640$ bits;

2. the first scale factor for the first position, the second scale factor for the second and third positions s1 s3                                                               01
   s1 s2 data flow for a frame $(2 * 6 \text{ bit}+2 \text{ bit}) * 32=448$ bits;

3. the first scale factor for the first and second positions, the third scale factor for the third position s2 s3                                                               10
   s1 s3 data flow for a frame $(2 * 6 \text{ bit}+2 \text{ bit}) * 32=448$ bits;

4. one scale factor for all three positions s1                                                                  11
   s2
   s3 data flow for a frame $(1 * 6 \text{ bit}+2 \text{ bit}) * 32=256$ bits.

If one considers only three timely successive scale factors (in the example the frame corresponds to exactly 24 ms), the advantage of a low decoder delay and a small access unit (smallest unit to be decoded) results. If these advantages are not important, a greater data reduction can be realized as follows if larger time sections are considered:

by means of an input matrix that has a larger number of columns;

by transmitting the information "do not transmit scf" for a frame.

Numerical example:

| | | | | | | |
|---|---|---|---|---|---|---|
| successive scale factors: | 10 | 40 | 38 | 37 | 36 | 38 |
| calculated differences: | | 30 | −2 | −1 | | +2 |
| assigned class: | | $L_5$ | $L_2$ | $L_2$ | | $L_4$ |
| transmission pattern: | | scf1 scf2 scf2 | | max(scf1, scf2, scf3) | | |
| transmitted scale factor(s): | 10, | 40 | | 38 | | |
| control information: | | 01 | | 00 | | |
| decoded scale factors: | 10 | 40 | 38 | 38 | | 38 |

I claim:

1. A method of transmitting digitized block coded audio signals comprising the steps of:

forming nK scale factors of the digitized audio signals based on a peak value of a sequence of sampled signal values of the digitized audio signals, where n is the number of frequency sub-bands or groups of spectral values of the digitized audio signals and n is greater than or equal to 1, and K is the number of successive in-time scale factors for each frequency sub-band or for a group of spectral values of the audio signals;

forming n(k−1) differences from the k successively in-time scale factors for each frequency sub-band or for a group of spectral values of the audio signals;

grouping the n(k−1) differences into at least two value classes with each value class including at least one possible difference of scale factors;

selecting new scale factors for each of the n sub-bands or spectral value groups based on a sequence of (k−1) value classes, a quantity of successive, different selected new scale factors within each sequence of (k−1) value classes being less than or equal to a quantity of successive different scale factors of each sub-band or spectral value group;

assigning identifying information to each sequence of (k−1) value classes, the identifying information identifying an association of each of the selected new scale factors with at least one of the k sequences of the sampled signal values for each respective sub-band or spectral value group and including control information indicating at which locations in the sequence of (k−1) value classes the selected new scale factors are disposed;

determining a transmission pattern of new scale factors separately for each of the n sub-bands or spectral value groups based the selected new scale factors and the assigned identifying information and based on psychoacoustic aspects with respect to pre-masking and post-masking effects of a human auditory system with a distinction being made between psycho-acoustically relevant changes in the scale factors;

transmitting the determined transmission pattern of the new scale factors;

receiving the transmitted new scale factors; and regenerating audio signals from the sampled signal values and from the assigned selected new scale factors.

2. A method according to claim 1, wherein the control information indicates when no new scale factor is being transmitted, that a preceding new scale factor is applicable for all relevant k sequences of sampled signal values.

* * * * *